United States Patent [19]

Moreau

[11] 4,282,493
[45] Aug. 4, 1981

[54] REDUNDANT CLOCK SIGNAL GENERATING CIRCUITRY

[75] Inventor: Deborah L. Moreau, Barrington, Ill.

[73] Assignee: Motorola, Inc., Schaumburg, Ill.

[21] Appl. No.: 54,068

[22] Filed: Jul. 2, 1979

[51] Int. Cl.³ .............................................. H03L 7/00
[52] U.S. Cl. ...................................... 331/2; 307/219;
331/49; 331/55; 331/56; 331/DIG. 2
[58] Field of Search ............... 331/49, 55, 56, DIG. 2;
307/219; 328/104

[56] References Cited

U.S. PATENT DOCUMENTS

| 3,769,607 | 10/1973 | Thelen ............................... 331/49 X |
| 3,795,872 | 3/1974 | Napolitano et al. .................... 331/49 |
| 4,025,874 | 5/1977 | Abbey ..................................... 331/55 |

*Primary Examiner*—Siegfried H. Grimm
*Assistant Examiner*—Edward P. Westin
*Attorney, Agent, or Firm*—Rolland R. Hackbart; James W. Gillman

[57] ABSTRACT

A clock signal generator for providing redundant clock signals includes two clock modules that utilize phase-locked loop oscillators for generating clock and reference signals and for diagnosing malfunctions of the generated clock and reference signals. One clock module is selected as the master, and the other clock module is the slave, being phase and frequency locked to the master. Switching the master between the clock modules may be externally initiated by select signals and also is automatically initiated when malfunctions are detected. The master and slave clock modules are always phase and frequency locked to one another, even if both clock modules are malfunctioning. When both clock modules experience simultaneous malfunctions, the master is selected in accordance with the externally generated select signals. Since the master and slave clock modules are always phase and frequency locked, switching the master is transparent to clock signal utilization circuitry. The redundant clock signal generator may be advantageously utilized in time-division-multiplex communication systems where uninterruped clock signals are necessary for signal transmission and reception.

17 Claims, 9 Drawing Figures

REDUNDANT CLOCK SIGNAL GENERATING CIRCUITRY

BACKGROUND OF THE INVENTION

The present invention relates to clock signal generating circuitry for communications systems and, more particularly, to redundant clock signal generating circuitry for reliably providing an uninterrupted clock signal.

In time-division-multiplex (TDM) communication systems, it is necessary to have a continuous and uninterrupted clock signal in order to properly receive and transmit digitized speech signals multiplexed on incoming and outgoing highways. In the prior art, clock generating circuits have utilized two oscillators, such as those described in U.S. Pat. Nos. 3,628,158 and 3,795,872; three oscillators, such as that described in U.S. Pat. No. 3,662,277; and even four oscillators, such as that described in U.S. Pat. No. 3,769,607, in efforts to more reliably provide an uninterrupted clock signal.

Switching between the several clock signals may be based on any of several criteria, such as the loss of one signal, phase slippage between signals, and frequency differences such as that reflected by changes in the pulse widths of the signals. However, when switching between clock signals, it is extremely important that the switching be transparent to circuitry utilizing the clock signals. Thus, each of the clock signals must be phase and frequency coincident with one another, otherwise switching may cause phase discontinuities and momentary bit transitions. Phase-locked loop techniques have been utilized to some degree to provide for transparent switching. In clock generators utilizing phase-locked loop oscillators, a malfunction typically causes both oscillators to free run, thus, no longer maintaining phase and frequency coincidence between the clock signals provided thereby. Switching in response to any further malfunctions would then introduce the possibility of phase discontinuities and momentary bit transitions.

Accordingly, it is an object of the present invention to provide an improved clock signal generator for providing redundant clock signals that are both phase and frequency coincident with one another.

It is another object of the present invention to provide an improved clock signal generator for providing redundant clock signals that are continuously phase and frequency coincident with one another, regardless of which is designated the master clock signal.

It is yet another object of the present invention to provide an improved clock signal generator for providing redundant clock signals that also provides for improved diagnosis of malfunctions therein.

It is yet a further object of the present invention to provide an improved clock signal generator for providing redundant clock signals, wherein designation of the master clock signal may be externally controllable.

SUMMARY OF THE INVENTION

In practicing the invention, there is provided a clock signal generator for generating redundant clock signals having a predetermined nominal frequency. The clock signal generator includes first, second, third and fourth phase-locked loop (PLL) oscillators, and control circuitry for providing a control signal for causing either the first or the third PLL oscillator to free run. The first PLL oscillator provides a first clock signal that is phase lockable to a second clock signal in response to a predetermined first state of the control signal and that free runs at the predetermined nominal frequency in response to a predetermined second state of the control signal. The second PLL oscillator is coupled to the first PLL oscillator for phase locking to the first clock signal and providing an out-of-lock indication signal when the second PLL oscillator is not phase-locked to the first clock signal. The third PLL oscillator provides the second clock signal that is phase lockable to the first clock signal in response to the predetermined second state of the control signal, and that free runs at the predetermined nominal frequency in response to the predetermined first state of the control signal. The fourth PLL oscillator is coupled to the third PLL oscillator for phase locking to the second clock signal and providing an out-of-lock indication signal when the fourth PLL oscillator is not phase locked to the second clock signal. The control circuitry is coupled to the out-of-lock indication signals from the second and fourth PLL oscillators and provides the predetermined first state of the control signal in response to the out-of-lock indication signal from the second PLL oscillator and the pedetermined second state of the control signal in response to the out-of-lock indication signal from the fourth PLL oscillator. Thus, the second and fourth PLL oscillators continuously monitor both the phase and frequency of the first and third PLL oscillators, respectively, and upon detection of a disparity therebetween, provide their respective out-of-lock indication signals.

According to a further feature of the present invention, a select signal may be provided for controlling which of the first or third PLL oscillators is to free run. The control circuitry is responsive to a first or second state of the select signal for providing a corresponding state of the control signal to select between the first and third PLL oscillators. An out-of-lock indication signal from either the second or the fourth PLL oscillators will cause the third or the first PLL oscillators, respectively, to free run regardless of the state of the select signal. However, if both of the out-of-lock indication signals from the second and fourth PLL oscillators are present, the select signal will control which of the first or third PLL oscillators is to free run.

DETAILED DESCRIPTION OF THE PREFERRED EMBODIMENT

Figure 1:
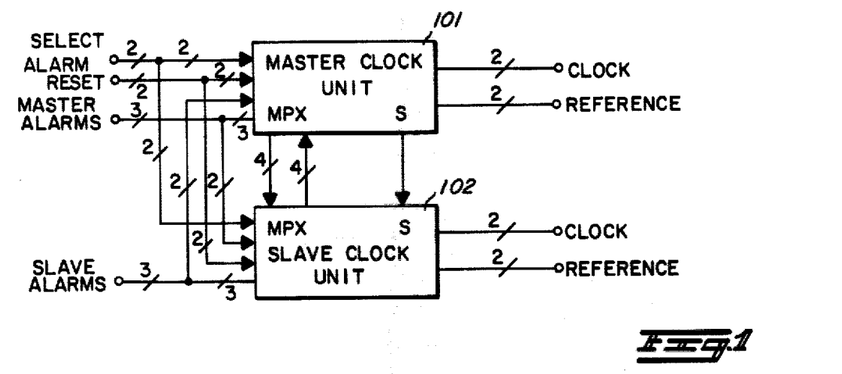
FIG. 1 is a block diagram showing the interconnections between two clock modules arranged according to the present invention for generating redundant clock signals.

In FIG. 1, there is illustrated a clock signal generator including two clock modules 101 and 102 arranged according to the present invention for generating redundant clock and reference signals. The clock signal generator of the present invention is advantageously adapted to be utilized in a TDM communication systems, such as the pulse-code-modulation (PCM) communication system described in U.S. Patent applications, Ser. No. 876,955, entitled "Radio Telephone Communications System" by Kevin M. Colosia, et al and application Ser. No. 876,956, entitled "A Method and Apparatus For A Radio Telephone Communication System" by Richard I. Little, et al, both filed Feb. 13, 1978, and assigned to the instant assignee. In such PCM communication systems, it is necessary to have a continuous and uninterrupted clock signal for proper reception and transmission of digitized speech signals multiplexed on incoming and outgoing PCM highways, and it is also necessary to have a reference signal for synchronization to supervisory signalling associated with each speech channel. The sampling of the digitized speech signals is typically performed at an 8 KHz rate, where the time interval between the taking of samples is commonly referred to as a "frame". The number of channels allocated to a frame may be either 24 channels or 32 channels depending on the PCM format utilized. Supervisory signalling for each speech channel is also transmitted with the digitized speech signals, and is repeated for every group of consecutive frames, commonly referred to as a "superframe". Each superframe includes twelve frames for the 24-channel format and sixteen frames for the 32-channel format.

The particular characteristics of PCM transmission systems have been standardized by the CCITT in sections Q.46 and Q.47 of the GREEN BOOK, Vol. 3, Sec. 7, entitled "Digital Transmission Systems", published by the Fifth Plenary assembly at Geneva, in 1972. The two formats specified by the CCITT in sections Q.46 and Q.47 may be referred to as the 32-channel format and the 24-channel format, respectively. According to these two PCM formats, the digitized speech signals are multiplexed onto PCM highways which are transmitted at a rate of 1.544 MHz for the 24-channel format and 2.048 MHz for the 32-channel format. Thus, highly reliable clock signals are necessary for the proper reception and transmission of the digitized speech signals carried in these high speed PCM highways. For example, if the clock signal slips relative to the bits of a PCM highway, the digitized speech signals of each channel will correspondingly slip resulting in degradation of the speech signals. Similarly, if superframe synchronization is lost, supervisory signalling for each speech channel will also be lost. Thus, it is extremely important to maintain the precise frequency of the clock signal, and to maintain superframe synchronization.

The clock modules 101 and 102 of FIG. 1 provide redundant clock signals which are maintained precisely at a frequency of 3.088 MHz for the 24-channel format or 4.096 MHz for the 32-channel format, and also provide redundant reference signals which provide a momentary pulse at the beginning of each successive superframe. Clock modules 101 and 102 may be selectively designated either the master clock module or the slave clock module under control of two select signals. However, once one clock module is selected to be the master, the other clock module is a slave, being phase locked to the master. On the selected master clock module, a PLL oscillator is allowed to free run, while on the slave clock module, a PLL oscillator is always phase and frequency locked to the clock signal provided by the master clock module.

Each clock module 101 and 102 also contains malfunction detection circuitry for providing three alarm indications, two of which are coupled to the other clock module. The malfunction detection circuitry on each clock module 101 and 102 may be reset under control of two reset signals. Thus, for example, external processing circuitry, such as microcomputer (MCU) 103, may be coupled to the clock modules 101 and 102 for providing the select signals and reset signals, and for processing the alarm indication signals. In addition the microcomputer 103 may, on a periodic basis, alternately select clock modules 101 and 102 as the master in order to be sure that both modules are fully operational. Furthermore, redundant microcomputers 103 may be coupled to clock modules 101 and 102. In this case, one of the microcomputers 103 provides one select signal and alarm reset signal, and the other microcomputer 103 provides the other select signal and one alarm reset signal. Either of the microcomputers 103 may cause alternate selection of clock module 101 or 102 as the master by providing its respective select signal.

Figure 2:
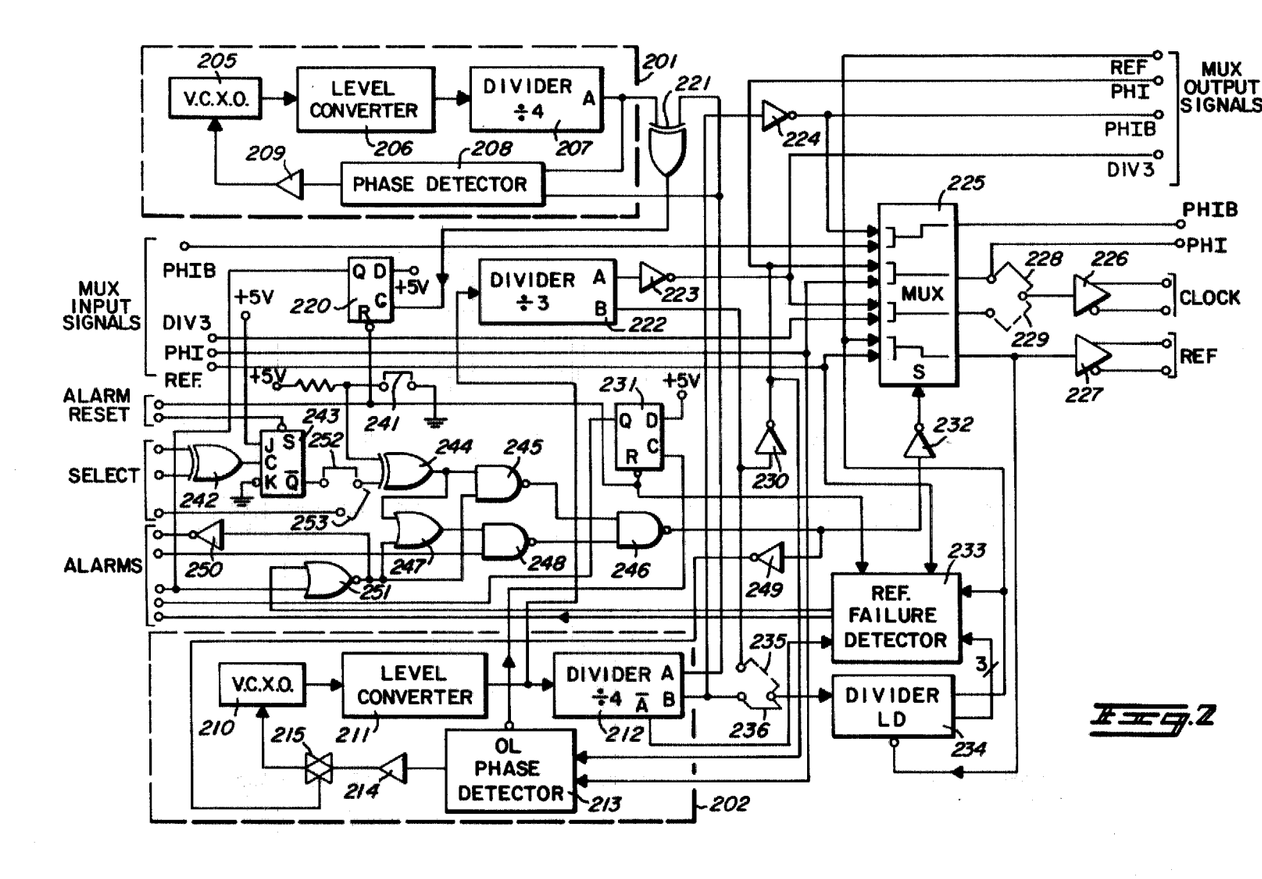
FIG. 2 is a detailed block diagram of a clock module embodying the present invention.

The detailed operation of each clock module may be more easily understood by reference to the detailed block diagram of FIG. 2. Referring to FIG. 2, each clock module includes two PLL oscillators 201 and 202. PLL oscillator 202 is utilized to develop the clock and reference signals provided at the output of the clock module, while PLL oscillator 201 is utilized to monitor both the phase and frequency of PLL oscillator 202. The clock module provides at the output of differential driver 226, a clock signal that has a frequency of twice the PCM data transmission rate, i.e. 3.088 MHz for the PCM transmission rate of 1.544 MHz for the 24-channel format and 4.096 MHz for the PCM data transmission rate of 2.048 MHz for the 32-channel format. The clock module also provides at the output of differential driver 227, a reference signal which is a momentary pulse that is one clock cycle interval long at the beginning of each successive superframe, which occurs once every 1.5 millisecond for the 24-channel format and once every 2.0 millisecond for the 32-channel format. The clock and reference signals provided at the output of differential drivers 226 and 227 may be differentially distributed to all units of a PCM communication system. The distribution of the clock and reference signals may be accomplished by means of equal lengths of cable pairs, for example, cable pairs that are each thirty feet long and introduce at most nine nanoseconds of skew relative to one another. The cable pairs are terminated at the receiving end by corresponding differential receivers. Any suitable differential drivers and receivers may be utilized, such as, for example, the RS-422 compatible Motorola MC3487 and MC3486.

Each PLL oscillator consists of a frequency-modulatable voltage-controlled crystal oscillator (VCXO) 250 and 210, level control circuitry 206 and 211, a divide-by-four Johnson Counter 207 and 212, a phase detector 208 and 213 and an amplifier 209 and 214. PLL oscillator 202 additionally includes an analog switch 215 so that the loop may be opened in order to allow PLL oscillator 202 to free run. Thus, PLL oscillator 202 of the selected master clock module will be enabled to free run by opening analog switch 215. VCXO's 205 and 210 are high stability crystal oscillators of the frequency-modulatable type, such as, the Motorola KXN1019B.

Figure 3:
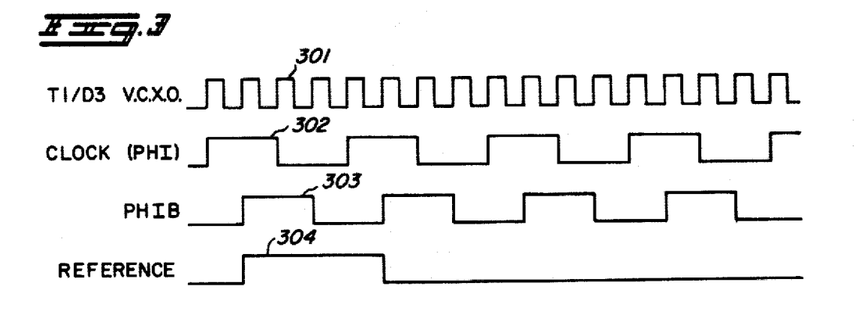
FIG. 3 is a timing diagram illustrating the waveforms of selected signals of the clock module of FIG. 2.
Figure 4:
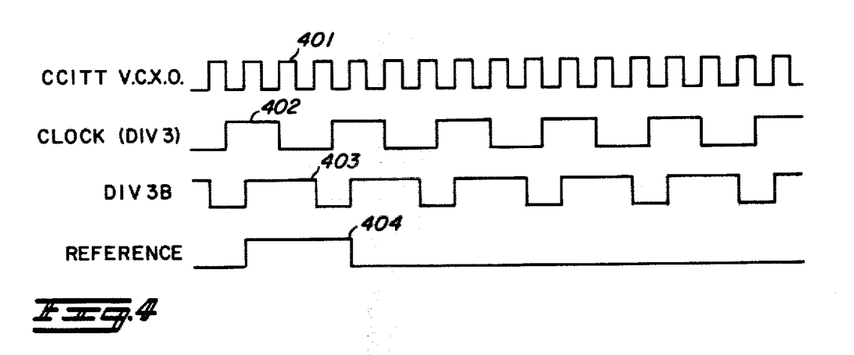
FIG. 4 is a timing diagram illustrating the waveforms of selected signals of the clock module of FIG. 2.

The VCXO's 205 and 210 provide an oscillator signal having a precise and stable frequency, for example, the Motorola KXN1019B, provides an oscillator frequency that is initially adjusted to within one part-per-million and that has a ten part-per-million warp range and a five part-per-million temperature characteristic. The VCXO's 205 and 210 have a nominal frequency of 12.288 MHz for the 32-channel format and 12.352 MHz for the 24-channel format. For the 24-channel format, the clock signal is provided at the A output of divider 212, while for the 32-channel format, at the A output of divider 222. Jumper wires 235 and 236 are provided for selecting between the B output of divider 212 for the 24-channel format and the B output of divider 222 for the 32-channel format, which selected output is coupled to the reference divider 234. Jumper wires 228 and 229 are provided for selecting between the 3.088 MHz clock signal for the 24-channel format and the 4.096 MHz clock signal for the 32-channel format. Thus, jumpers 228 and 236 are present for the 24-channel format, while jumpers 229 and 235 are present for the 32-channel format. The waveforms of the oscillator signal from VCXO 210, the clock signals from divider 212 and the reference signal from divider 234 are illustrated in FIG. 3 for the 24-channel format. The waveforms for the oscillator signal from VCXO 210, the clock signals from divider 222 and the reference signal from divider 234 are illustrated in FIG. 4 for the 32-channel format. The reference signal provided by divider 234 is a momentary pulse that envelopes one clock cycle interval at the beginning of each successive superframe.

Each clock module includes a multiplexer 225 for selecting between the clock and reference signals generated on the module itself or clock and reference signals from the other clock module ("MUX INPUT SIGNALS"). The control logic of each clock module insures that the clock and reference signals provided at the output of multiplexer 225 are those from the selected master clock module.

Selection of a clock module as the master may be in response to the select signals coupled to gate 242 or in response to malfunctions detected on one or the other of the clock modules. The malfunction circuitry of each clock module includes out-of-lock indication signals provided by PLL oscillators 201 and 202 and reference failure indication signals provided by reference failure detector 233. In the absence of any detected malfunctions, the select signals control the selection of the master by controlling the state of flip-flop 243. A momentary pulse on either of the select signals will cause a corresponding momentary pulse at the output of the exclusive OR gate 242 which will cause flip-flop 243 to change states. Flip-flop 243 on only one of the clock modules is utilized by appropriately arranging jumpers 252 and 253. Thus, the output of flip-flop 243 from one clock module is coupled to the input of its exclusive OR gate 244 and the input of the exclusive OR gate 244 on the other module. For example, jumpers 252 and 253 may be present on one clock module, while only jumper 253 is present on the other clock module. Also, for proper operation, jumper 241 is present on one clock module and absent on the other clock module. Thus, regardless of the present state of flip-flop 243, the clock module without jumper 241 may always be selected by activation of the reset signal coupled to the set input of flip-flop 243. When the reset signal forces the Q output of flip-flop 243 to be a logical zero, exclusive OR gate 244 provides a logical one output signal, resulting in a logical zero output signal at the output of inverting gates 249 and 232. A logical zero at the output of inverting gate 249 causes analog switch 215 to open, thereby causing PLL oscillator 202 to free run. A logical zero output from inverting gate 232 causes multiplexers 225 to select the clock signals generated on its clock module.

Assuming that the clock module in FIG. 2 is a master, a subsequent momentary pulse on either of the select signals to exclusive-OR gate 242 will cause the Q output from flip-flop 243 to change state. As a result, analog switch 215, which was previously open, will now be closed causing PLL oscillator 202 to phase and frequency lock to the clock signal received from the other clock module, and multiplexer 225 will be enabled to select the "MUX INPUT SIGNALS" from the other clock module. Switching the master from one clock module to the other will not cause any phase discontinuities or momentary bit transitions on either of the clock or reference signals provided by differential amplifiers 226 and 227 because the master and slave clock modules are phase locked with one another prior to and after switching.

Switching the master from one clock module to the other may also be initiated upon detection of a malfunction. If an out-of-lock condition is detected between PLL oscillators 201 and 202 or if a reference failure has been detected, NOR gate 251 will provide a logical zero state, causing its clock module to become the slave. Phase or frequency differences between PLL oscillator 201 and 202 result in momentary transitions at the output of exclusive OR gate 221. The momentary transitions on the output of exclusive OR gate 221 clock the Q output of flip-flop 220 to a logic one state, indicating an out-of-lock malfunction. The logical one state of the Q output from flip-flop 220 causes the output of NOR gate 251 to become a logical zero.

Phase detector 213 also provides momentary transitions at its out-of-lock detector OL in response to frequency and phase differences between PLL oscillator 202 and the PHI clock signal received from the other clock module. Any suitable phase detector with an out-of-lock detector, such as the Motorola MC4044, may be utilized as phase detector 213. The momentary transitions on the OL output from phase detector 213 clock the Q output of flip-flop 231 to a logical one state, also indicating an out-of-lock malfunction. However, switching between the master and slave is not initiated in response to a logical one state from flip-flop 231, since malfunctions on the other clock module may have activated flip-flop 231. In contrast, exclusive OR gate 221 and reference failure detector 233 only detect malfunctions of their clock module. The out-of-lock indication signals from PLL oscillators 201 and 202 may be provided by a separate out-of-lock detector, such as exclusive OR 221, or may be part of the phase detector, such as phase detector 213, depending on the suitability of the out-of-lock detector provided in conventional phase detectors. The out-of-lock indication signals from flip-flops 220 and 231 and a reference failure indication signal from reference failure detector 233 are also provided to external circuitry for malfunction diagnosis.

In order to insure that one clock module is always phase locked to the other clock module, the output of NOR gate 251 is coupled via inverting gate 250 to NAND gate 248 on the other clock module. Thus, if a malfunction is detected on both clock modules, NOR gates 251 from each clock module will provide a logical zero at its output, which via inverting gate 250 will provide a logical one state for enabling NAND gate 248 on the other clock modules. The logical zero output from NOR gate 251 on each clock module also enables NAND gate 245 and causes OR gate 247 to pass the output of exclusive OR gate 244 to NAND gate 248. Thus, when both clock modules are malfunctioning, the select lines will control which is the master via exclusive OR gate 244.

The master or slave status of each clock module may be displayed by providing a visual indicator reflecting the state of the output of NAND gate 246. Maintenance personnel may remove and replace the slave module at any time without affecting the operation of the master. Thus, the slave clock module may be removed either merely for visual inspection or for malfunction diagnosis if a malfunction has been detected.

Figure 5:
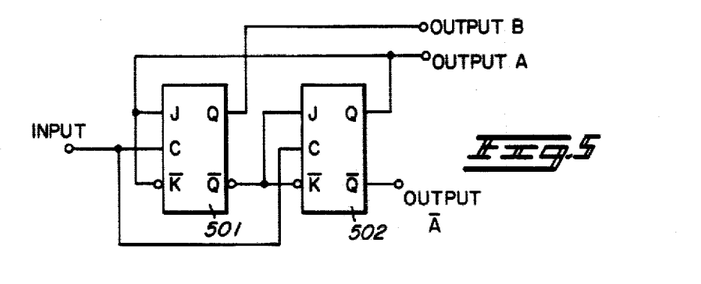
FIG. 5 is a detailed block diagram of the modulo four divider blocks in the clock module of FIG. 2.
Figure 6:
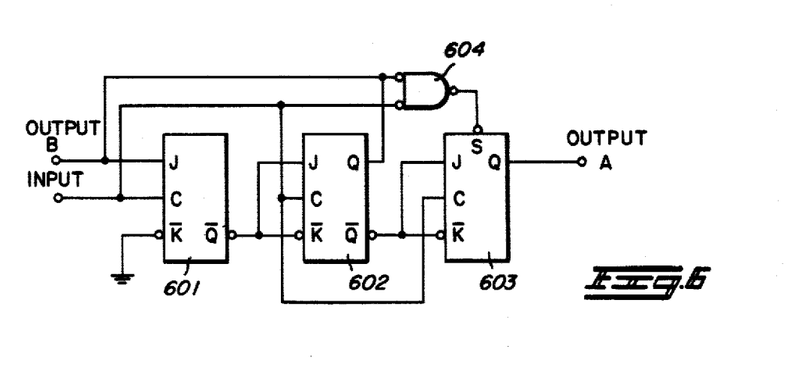
FIG. 6 is a detailed block diagram of the module three divider block in the clock module of FIG. 2.

The dividers 207 and 212 and divider 222 of FIG. 2 are illustrated in more detail in FIG. 5 and FIG. 6, respectively. The divider of FIG. 5 includes flip-flop 501 and 502 for dividing the input signal (301 of FIG. 3) by four to provide two output signals phased by ninety degrees with respect to one another, output A (302 of FIG. 3) and output B (303 of FIG. 3). The divider of FIG. 6 includes flip-flops 601–603 and gate 604 for dividing the input signal (401 of FIG. 4) by three to provide a 50% duty cycle output A (402 of FIG. 4) and another modulo three output B (403 of FIG. 4).

Figure 7:
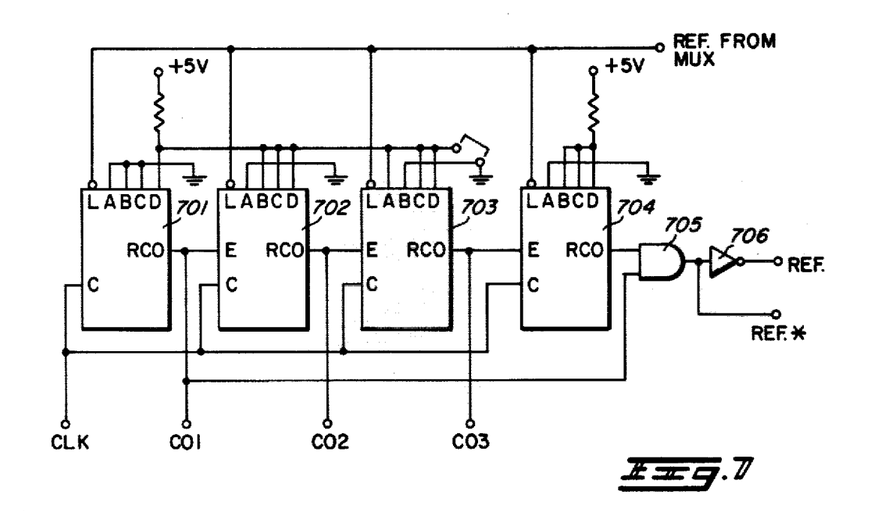
FIG. 7 is a detailed block diagram of the reference divider block in the clock module of FIG. 2.

The reference divider 234 of FIG. 2 is illustrated in more detail in FIG. 7. The reference divider of FIG. 7 consists of four divide-by-sixteen counters 701–704 which are all synchronously clocked by the input clock signal from the B output of divider 212 or divider 222 of FIG. 2. Each divider provides a ripple carry output, RCO, as its last state. Each RCO signal is a momentary pulse having a pulse width of one clock cycle interval. Thus, the reference signal formed by ANDing the RCO's from counters 701 and 704 and provided at the output of inverting gate 706 also has a pulse width of one clock cycle interval. The reference signal from the multiplexer 225 of FIG. 2 is fed back to the load input of each of the dividers 701–704 for presetting the dividers to a predetermined state depending on whether the 24-channel or 32-channel format is being utilized. The preset state of the dividers 701–704 is selected so that the reference signal is provided at the beginning of each successive superframe. The jumper 707 from the D input of divider 703 to ground is present to provide the preset state for the European format and is absent to provide the preset state for the 24-channel format.

Figure 8:
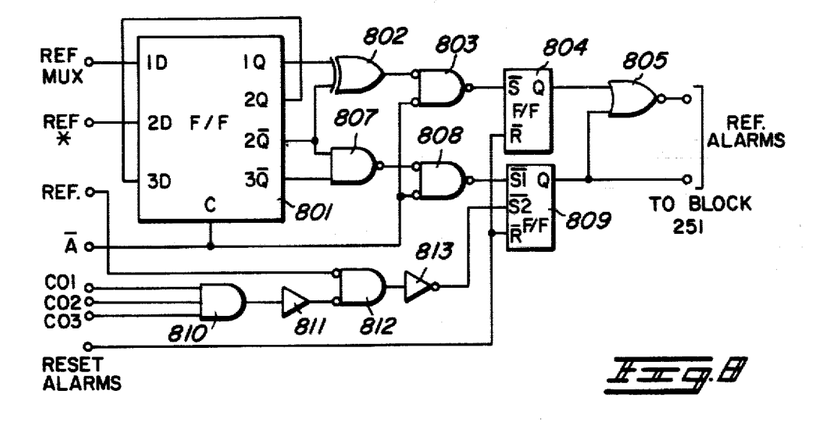
FIG. 8 is a detailed block diagram of the reference failure detector block in the clock module of FIG. 2.

The reference failure detector 233 of FIG. 2 is illustrated in more detail in FIG. 8. Flip-flop 801 is a latch which is continuously loaded by the clock signal from jumpers 235 and 236 with the reference signal, REF*, from divider 234 and the reference signal from the other clock module. Discrepancies between the reference signals from the two clock modules are detected by exclusive OR gate 802, which provides a momentary transition at its output when the reference signals differ. A momentary pulse from exclusive OR gate 802 via gate 803 sets the Q output of flip-flop 804 to a logical one state. The output of flip-flop 804 is coupled together with the output of flip-flop 809 via NOR gate 805 to provide a reference alarm signal to external circuitry for malfunction diagnosis.

The 2Q output of flip-flop 801 is fed back to the 3D input for delaying the reference signal by a time interval of one cycle of the clock signal. The $2\overline{Q}$ and $3\overline{Q}$ outputs are then gated by NAND gate 807, which provides a logical zero state if the generated reference signal is longer than one cycle interval of the clock signal. Thus, if the reference signal is too long, gate 808 will provide a logical zero state for setting the Q output of flip-flop 809 to a logical one state.

The Q output of flip-flop 809 may also be set to a logical one state by a logical zero pulse from inverting gate 813. Inverting gate 813 will provide a logical zero pulse if the reference signal, REF, has a logical zero state while any of the ripple carry outputs, CO1, CO2 and CO3, have a logical zero state. The Q output from flip-flop 809 is coupled to NOR gate 251 on FIG. 2, and will cause switching to the other clock module when detecting either a malfunction indicating that the reference signal is too long or a malfunction indicating a glitch on the reference signal.

Figure 9:
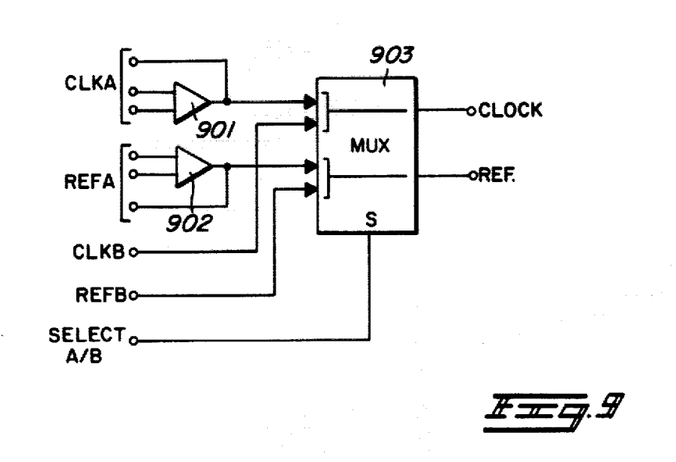
FIG. 9 is a typical block diagram of clock signal utilization circuitry.

In FIG. 9, there is illustrated typical circuitry which may utilize the clock and reference signals. In a redundant PCM communication system, duplicate utilization modules may be provided for all required functions, which each include the circuitry illustrated in FIG. 9. In one utilization module, clock and reference signals may be received from one clock module, while in the other utilization module, clock and reference signals may be received from the other clock module. The clock and reference signals received by differential receivers 901 and 902 are coupled to the multiplexer 903 and also to the multiplexer 903 located on the other utilization module. Under control of the select A/B signal, each multiplexer 903 on the utilization modules would select and use the clock and reference signals from the same clock module.

In summary, an improved clock signal generator for providing redundant clock signals that are continuously phase and frequency coincident with one another has been described. The clock signal generator includes two clock modules that utilize PLL oscillators for generating clock and reference signals and for diagnosing malfunctions of the clock and reference signals provided thereby. In the event that both clock modules experience simultaneous malfunctions, selection of one of the clock modules as a master is made under control of externally generated select signals. Thus, one of the clock modules is always a master and the other is always a slave which is phase-locked to the master. Switching the master from one clock module to another is substantially transparent to circuitry utilizing the clock signals therefrom.

I claim:

1. Circuitry for redundantly generating a clock signal having a predetermined nominal frequency, said circuitry comprising:

first phase-locked loop (PLL) means for providing a first clock signal that is phase lockable to a second clock signal in response to a predetermined first state of a control signal and that free runs at the predetermined nominal frequency in response to a predetermined second state of the control signal;

second PLL means coupled to the first PLL means for phase locking to the first clock signal and providing an out-of-lock indication signal when the second PLL means is not phase locked to the first clock signal;

third PLL means for providing the second clock signal that is phase lockable to the first clock signal in response to the predetermined second state of the control signal and that free runs at the predetermined nominal frequency in response to the predetermined first state of the control signal;

fourth PLL means coupled to the third PLL means for phase locking to the second clock signal and providing an out-of-lock indication signal when the fourth PLL means is not phase locked to the second clock signal; and control means for providing the control signal having a predetermined first state in response to the out-of-lock indication signal from the second PLL means and providing the control signal having a predetermined second state in response to the out-of-lock indication signal from the fourth PLL means.

2. The clock signal generating circuitry according to claim 1, wherein said first PLL means includes means for providing an out-of-lock indication signal when the first clock signal is not phase-locked to the second clock signal, said third PLL means includes means for providing an out-of-lock indication signal when the second clock signal is not phase-locked to the first clock signal.

3. The clock signal generating circuitry according to claims 1 or 2, further including multiplexing means coupled to the first and second clock signals, said multiplexing means providing the first clock signal in response to the predetermined second state of the control signal and providing the second clock signal in response to the predetermined first state of the control signal.

4. The clock signal generating circuitry according to claim 3, wherein each of the first, second, third and fourth PLL means include voltage-controlled crystal oscillator means, dividing means and phase detecting means.

5. The clock signal generating circuitry according to claim 1 further including means for providing a select signal having predetermined first and second states, said control means responsive to the predetermined first state and second state of the select signal for providing the control signal having the predetermined first state and second state, respectively, when both of the out-of-lock indication signals from the second and fourth PLL means are present and when neither of the out-of-lock indication signals are present.

6. The clock signal generating circuitry according to claim 1, wherein said second and fourth PLL means each include first and second exclusive OR gating means for providing the respective out-of-lock indication signals, the first exclusive OR gating means coupled to the second PLL means and the first clock signal, and the second exclusive OR gating means coupled to the fourth PLL means and the second clock signal.

7. Apparatus for redundantly generating a clock signal having a predetermined nominal frequency, said circuitry comprising:

(a) a first clock module including:
(i) first phase-locked loop (PLL) means for providing a first clock signal that is phase lockable to a second clock signal in response to a predetermined first state of a first control signal and that free runs at the predetermined nominal frequency in response to a predetermined second state of the first control signal;
(ii) second PLL means coupled to the first PLL means for phase locking to the first clock signal and providing an out-of-lock indication signal when the second PLL means is not phase locked to the first clock signal;
(iii) first control means coupled to the out-of-lock indication signal from the second PLL means for providing the first control signal having a predetermined first state in response to the presence of the out-of-lock indication signal from the second PLL means and providing the first control signal having a predetermined second state in response to the absence of the out-of-lock indication signal from the second PLL means;

(b) a second clock module including:
(i) third PLL means for providing a second clock signal that is phase lockable to the first clock signal in response to a predetermined first state of a second control signal and that free runs at the predetermined nominal frequency in response to a predetermined second state of the second control signal;
(ii) fourth PLL means coupled to the third PLL means for phase locking to the second clock signal and providing an out-of-lock indication signal when the fourth PLL means is not phase locked to the second clock signal; and
(iii) second control means coupled to the out-of-lock indication signal from the fourth PLL means for providing the second control signal having a predetermined first state in response to the presence of the out-of-lock indication signal from the fourth PLL means and providing the second control signal having a predetermined second state in response to the absence of the out-of-lock indication signal from the fourth PLL means.

8. The clock signal generating apparatus according to claim 7, further including means for providing a select signal having predetermined first and second states, said first control means, when both and when neither of out-of-lock indication signals from the second and fourth PLL means is present, being responsive to the predetermined first state of the select signal for providing the predetermined first state of the first control signal and being responsive to the predetermined second state of the select signal for providing the predetermined second state of the first control signal; and said second control means, when both and when neither of out-of-lock indication signals from the second and fourth PLL means is present, being responsive to the predetermined first state of the select signal for providing the predetermined second state of the second control signal and being responsive to the predetermined second state of the select signal for providing the predetermined first state of the second control signal.

9. The clock signal generating apparatus according to claim 8, wherein said first and third PLL means each include voltage-controlled crystal oscillator means, dividing means, phase comparator means and analog switching means coupled in a loop, where the phase comparator means further includes means for providing an out-of-lock indication signal, and the analog switching means is responsive to the predetermined first state of the respective first and second control signals for closing the loop and responsive to the predetermined second state of the respective first and second control signals for opening the loop; and wherein said second and fourth PLL means include voltage-controlled crystal oscillator means, dividing means and phase comparator means coupled in a loop, where the phase comparator means includes means for providing an out-of-lock indication signal.

10. The clock signal generating apparatus according to claim 9, wherein said first clock module includes first multiplexing means for selecting the second clock signal in response to the predetermined first state of the first control signal and selecting the first clock signal in response to the predetermined second state of the first control signal; and wherein said second clock module includes second multiplexing means for selecting the first clock signal in response to the predetermined first state of the second control signal and selecting the second clock signal in response to the predetermined second state of the second control signal.

11. The clock signal generating apparatus according to claim 10, further including output signal utilization means and output control means, said output control means responsive to the out-of-lock indication signals from the first, second, third and fourth PLL means for selecting one of the first and second multiplexing means, and coupling the clock signal from said selected one of the first and second multiplexing means to the output signal utilization means.

12. The clock signal generating apparatus according to claim 8 further including means for alternately providing the predetermined first and second states of the select signal for predetermined time intervals.

13. The clock signal generating apparatus according to claim 7, wherein said second and fourth PLL means each include first and second exclusive OR gating means for providing the respective out-of-lock indication signals, the first exclusive OR gating means coupled to the second PLL means and the first clock signal, and the second exclusive OR gating means coupled to the fourth PLL means and the second clock signal.

14. The clock signal generating apparatus according to claim 7, wherein said first clock module includes first dividing means coupled to the first clock signal for providing a first reference pulse signal at successive predetermined time intervals; and wherein said second clock module includes second dividing means coupled to the second clock signal for providing a second reference pulse signal at successive predetermined time intervals.

15. The clock signal generating apparatus according to claim 14, wherein said first clock module includes first timing means coupled to the first reference pulse signal for detecting when the first reference pulse signal has a pulse width greater than a predetermined pulse width and enabling the first control means to provide the predetermined first state of the first control signal; and wherein said second clock module includes second timing means coupled to the second reference pulse signal for detecting when the second reference pulse signal has a pulse width greater than a predetermined pulse width and enabling the second control means to provide the predetermined first state of the second control signal.

16. The clock signal generating apparatus according to claim 14 further including exclusive OR gating means coupled to the first and second reference pulse signals for providing an output signal when the first and second reference pulse signals are not substantially coincident with one another.

17. The clock signal generating circuitry according to claims 1 or 2, wherein said control means includes means for alternately providing the predetermined first and second states of the control signal.

* * * * *